(12) United States Patent
Chiou

(10) Patent No.: US 6,362,961 B1
(45) Date of Patent: Mar. 26, 2002

(54) CPU AND HEAT SINK MOUNTING ARRANGEMENT

(76) Inventor: Ming Chin Chiou, No. 2, Alley 1, Lane 160, Kai De st., Kau Hsiung City (TW)

(*) Notice: Subject to any disclaimer, the term of this patent is extended or adjusted under 35 U.S.C. 154(b) by 0 days.

(21) Appl. No.: 09/295,588

(22) Filed: Apr. 22, 1999

(51) Int. Cl.[7] .................................................. H05K 7/20
(52) U.S. Cl. ....................... 361/704; 248/510; 361/697; 439/487
(58) Field of Search .......................... 439/73, 485, 487; 248/316.7, 505, 510; 24/455, 457, 458; 267/150, 158, 160; 165/80.3, 185; 174/16.3; 257/719, 722; 361/687, 695, 697, 703, 704–707

(56) References Cited

U.S. PATENT DOCUMENTS

| | | | |
|---|---|---|---|
| 5,884,692 A | * | 3/1999 | Lee |
| 5,947,191 A | * | 9/1999 | Hitesheu |
| 5,982,622 A | * | 11/1999 | Chiou |
| 5,991,152 A | * | 11/1999 | Chiou |
| 6,008,989 A | * | 12/1999 | Lee |
| 6,043,984 A | * | 3/2000 | Tseng |

FOREIGN PATENT DOCUMENTS

JP     325159    *   2/1987  ................. 361/704

* cited by examiner

*Primary Examiner*—Gerald Tolin
(74) *Attorney, Agent, or Firm*—Bacon & Thomas

(57) ABSTRACT

A CPU and heat sink mounting arrangement, which includes a locating plate having downward hooks inserted through respective through holes at a CPU connector and a heat sink, and two retainer strips attached to respective transverse grooves at the heat sink and having retaining holes fastened to the downward hooks of the locating plate to secure the CPU connector and the heat sink together, wherein the retainer plates each have a finger strip for operation by hand to disengage the respective retaining holes from the downward hooks, and the locating plate has two transverse spring leaves at two opposite ends, which push the locating plate away from the CPU connector after disengagement of the retainer plates from the downward hooks of the locating plate.

1 Claim, 5 Drawing Sheets

CPU AND HEAT SINK MOUNTING ARRANGEMENT

BACKGROUND OF THE INVENTION

The present invention relates to a CPU and heat sink mounting arrangement in which two retainer plates are releasably fastened to a locating plate by a hooked joint to secure a heat sink to a CPU at a CPU connector, enabling heat to be quickly dissipated from the CPU through the heat sink.

During the operation of the CPU in a computer, heat must be quickly carried away from the CPU, so as not to affect normal operation of the CPU. A variety of heat sinks have been developed for this purpose. When a heat sink is used, it is attached to the top side wall of the CPU and secured in place by retainer means for quick dissipation of heat. According to conventional mounting arrangements, the retainer means cannot positively secure the heat sink in position during transportation of the computer.

SUMMARY OF THE INVENTION

It is one object of the present invention to provide a CPU and heat sink mounting arrangement which firmly secures the heat sink to the CPU. It is another object of the present invention to provide a CPU and heat sink mounting arrangement which enables the user to quickly disconnect the heat sink from the CPU for a replacement of the CPU. According to the present invention, the CPU and heat sink mounting arrangement comprises a locating plate having downward hooks at its four corners respectively inserted through respective through holes at a CPU connector, which holds a CPU, and respective through holes at a heat sink, and two retainer plates respectively attached to respective transverse grooves at the heat sink and fastened up with the downward hooks of the locating plate to secure the heat sink and the CPU connector together. The retainer plates each comprise a hooked portion curved in one direction at one end and hooked on one longitudinal side edge of the heat sink, a springy finger strip curved in the reversed direction at an opposite end for operation by hand to disengage the respective retainer plate from the downward hooks of the locating plate, and two retaining holes spaced between the hooked portion and the finger strip for engagement with the downward hooks of the locating plate.

DETAILED DESCRIPTION OF THE PREFERRED EMBODIMENT

Figure 1:
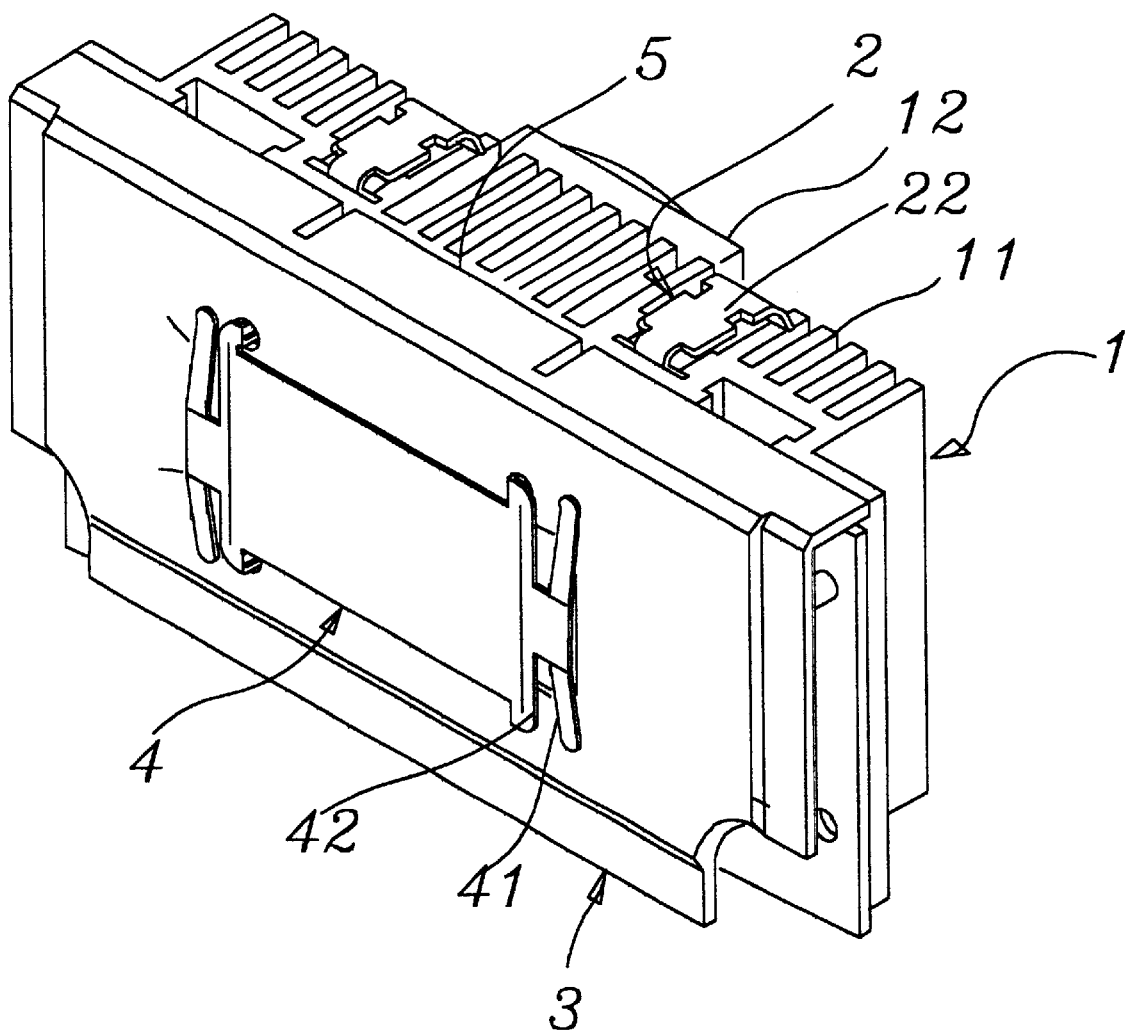
FIG. 1 is a perspective assembly view of the present invention.
Figure 2:
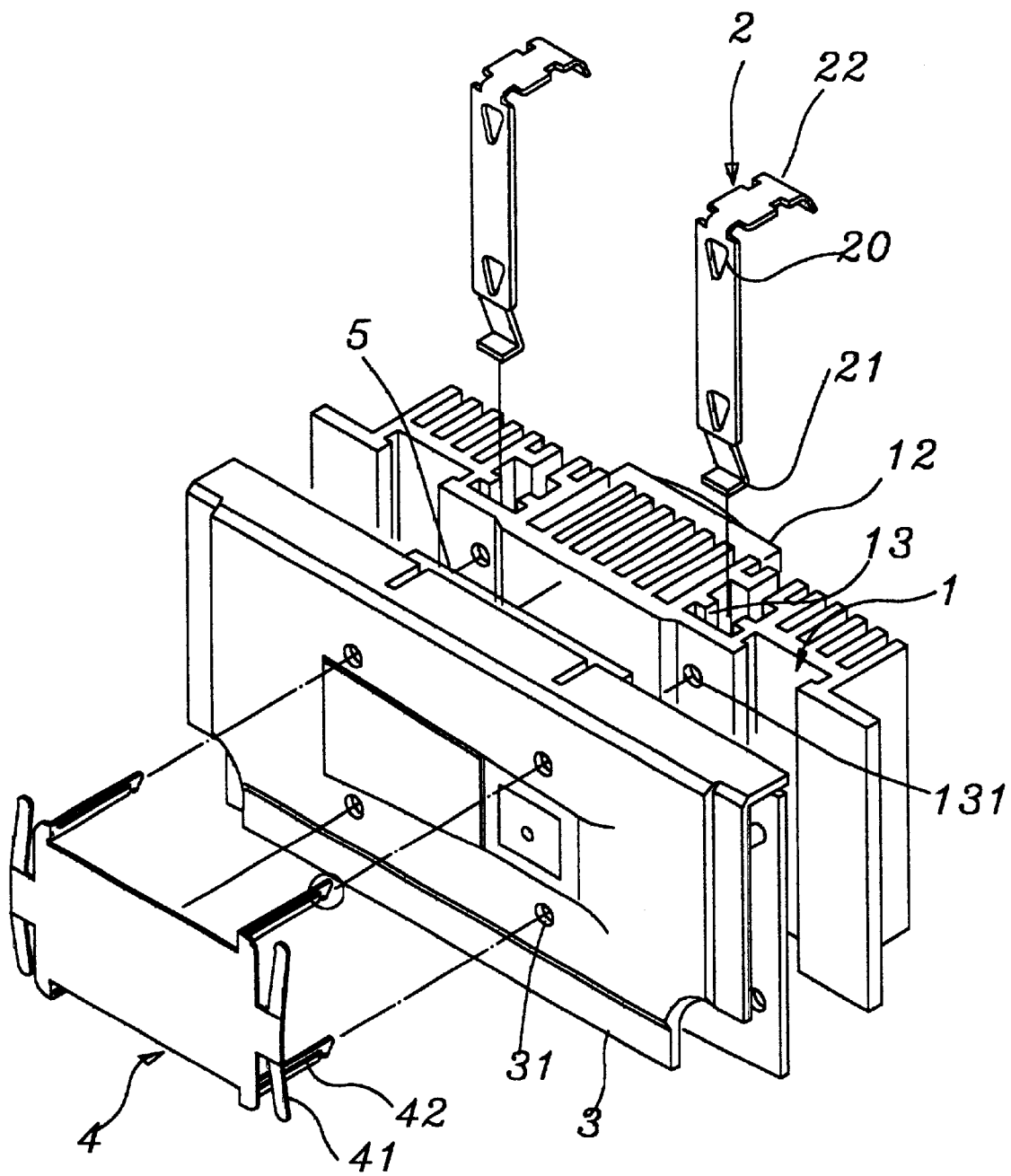
FIG. 2 is an exploded view of the assembly shown in FIG. 1.

Referring to FIGS. 1 and 2, a CPU and heat sink mounting arrangement in accordance with the present invention is shown comprised of a heat sink 1, two retainer plates 2, a CPU connector 3, and a locating plate 4. The heat sink 1 comprises a plurality of radiating fins 11 raised from its top side wall and arranged in parallel, two transverse grooves 13 defined at its top side wall between the fins 11, two pairs of through holes 131 respectively disposed in the transverse grooves 13, and a fan 12 mounted on the fins 11. The retainer plates 2 each comprise a hooked portion 21 curved in one direction at one end, a springy finger strip 22 curved in the reversed direction at an opposite end, and two retaining holes 20 spaced between the hooked portion 21 and the finger strip 22 corresponding to one pair of through holes 131 in one transverse groove 13 at the heat sink 1. The retaining holes 20 each are formed of a triangular hole and an elongated hole extended from one vertice of the triangular hole. The width of the retainer plates 2 is approximately equal to the transverse grooves 13. When attached to the transverse grooves 13, the hooked portion 21 of each retainer plates 2 is hooked on one longitudinal side edge of the heat sink 1. The locating plate 4 comprises two pairs of downward hooks 42 bilaterally perpendicularly raised from its two opposite ends, and two spring leaves 41 transversely disposed at its two opposite ends outside the downward hooks 42. The spring leaves 41 each have a middle part connected to the locating plate 4, and two opposite ends sloping outwardly downwards and then respectively curved upwards. The CPU connector 3 holds a CPU 5, having four through holes 31 corresponding to the through holes 131 at the heat sink 1. The downward hooks 42 of the locating plate 4 are respectively inserted through the through holes 31 at the CPU connector 5 and the through holes 131 at the heat sink 1, and then hooked in the retaining holes 20 at the retainer plates 2 to secure the CPU connector 3 and the heat sink 1 firmly together, enabling the flat bottom side wall of the heat sink 1 to be maintained in close contact with the top surface of the CPU 5.

Figure 3A:
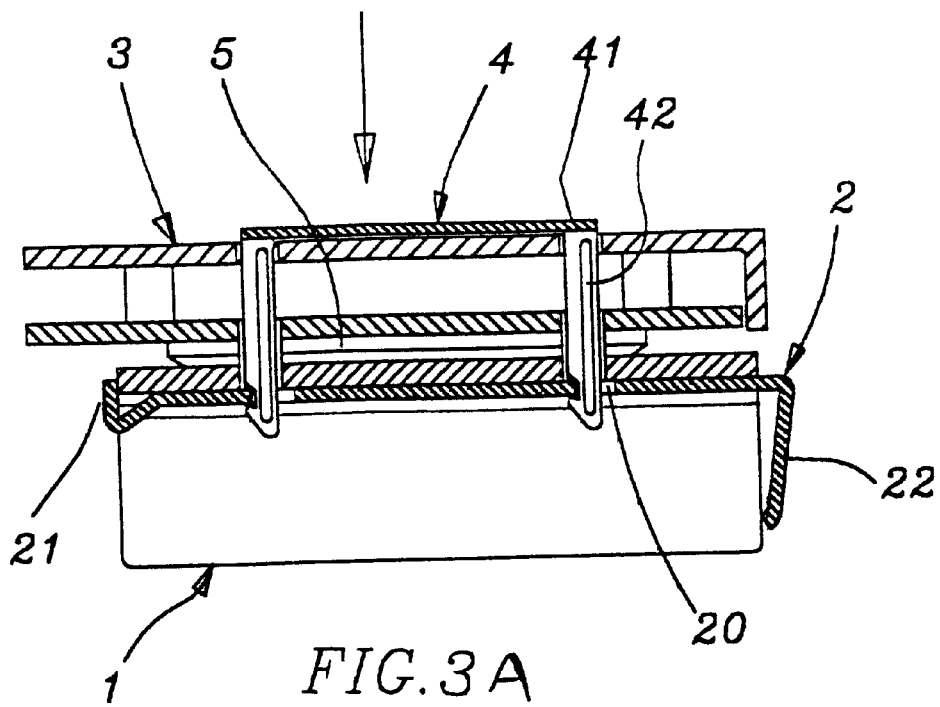
FIG. 3A is a sectional view showing the installation of the present invention.
Figure 3B:
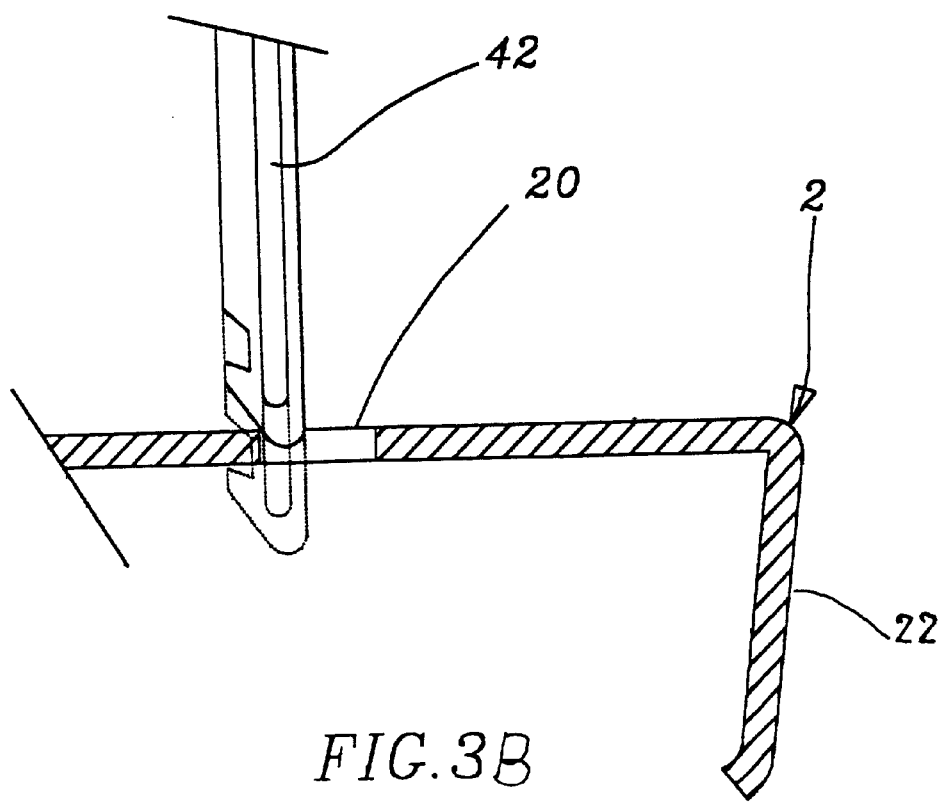
FIG. 3B is an enlarged view of a part of the present invention, showing the engagement between the downward hook and the corresponding retaining hole at the retainer plate.

Referring to FIGS. 3A and 3B, the retainer plates 2 are respectively attached to the transverse grooves 13 at the heat sink 1, then the CPU connector 3 is attached to the back side of the heat sink 1, and then the locating plate 4 is attached to the back side of the CPU connector 3, enabling the downward hooks 42 of the locating plate 4 to be respectively inserted through the through holes 31 at the CPU connector 5 and the through holes 131 at the heat sink 1 and then hooked in the retaining holes 20 at the retainer plates 2 to secure the CPU connector 3 and the heat sink 1 firmly together. When installed, two opposite ends of each of the spring leaves 41 are pressed on the bottom side wall of the CPU connector 3, and the flat bottom side wall of the heat sink 1 is firmly maintained in close contact with the top surface of the CPU 5.

Figure 4:
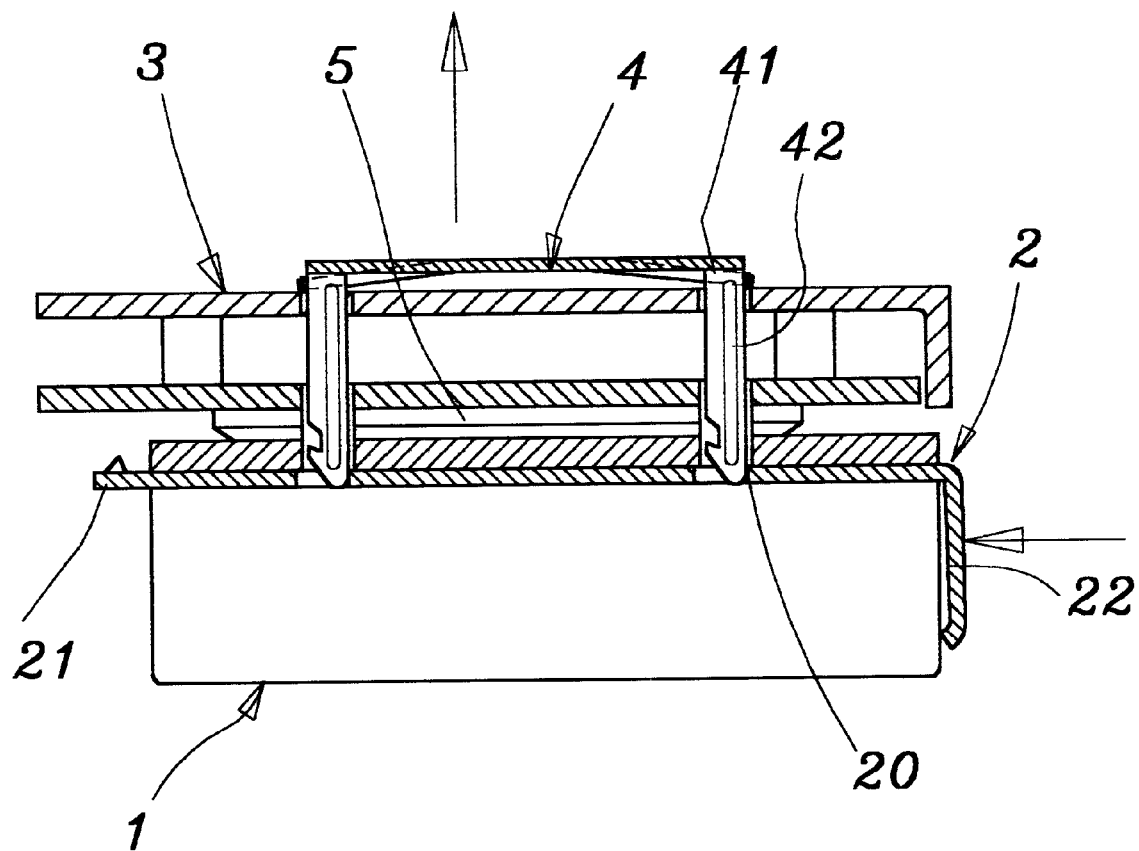
FIG. 4 is a sectional view showing the finger strip of the retainer plate pushed inwards, the retainer plate disengaged from the downward hooks of the locating plate according to the present invention.

Referring to FIG. 4, when removing the CPU 5 for a replacement, the finger strip 22 of each of the retainer plates 2 is respectively pushed forwards to disengage the retaining holes 20 of the retainer plates 2 from the downward hooks 42 of the locating plate 4. Upon disconnection of the downward hooks 42 from the retaining holes 20 at the retainer plates 2, the spring leaves 41 immediately return to their former shape and to push the locating plate 4 outwards from the CPU connector 3, enabling the locating plate 4, the CPU connector 3 and the heat sink 1 to be separated from one another.

Figure 5:
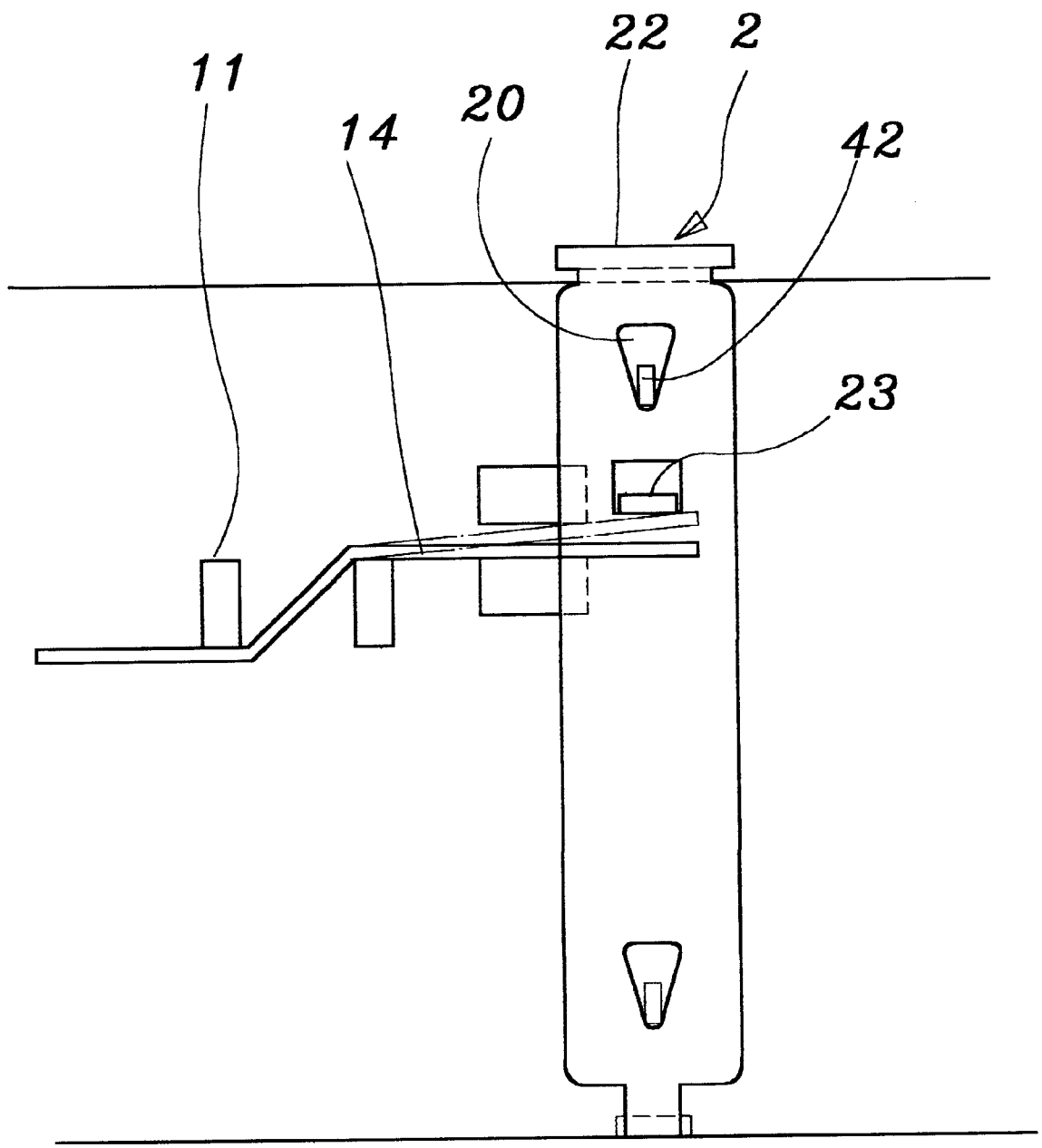
FIG. 5 shows an alternate form of the present invention.

Referring to FIG. 5, a springy stop plate 14 is fastened to the fins 11 at the heat sink 1, and the retainer strip 2 has a projecting portion 23, which is stopped at the free end of the springy stop plate 14 after installation of the retainer strip 2 in the heat sink 1. The springy stop plate 14 imparts a pressure to the retainer strip 2, causing the respective downward hooks 42 to be firmly hooked in the respective retaining holes 20.

It is to be understood that the drawings are designed for purposes of illustration only, and are not intended as a definition of the limits and scope of the invention disclosed.

What the invention claimed is:

1. A CPU and heat sink mounting arrangement comprising:

a heat sink having parallel fins and two transverse grooves at a top side wall thereof, and two pairs of through holes respectively disposed in said transverse grooves;

a CPU connector holding a CPU, said CPU connector having a plurality of through holes corresponding to the through holes at said heat sink;

two retainer strips respectively attached to the transverse grooves at said heat sink, said retainer strips each comprising a hooked portion curved in one direction at one end and hooked on one longitudinal side edge of said heat sink, a springy finger strip curved in the reversed direction at an opposite end, and two retaining holes spaced between said hooked portion and said finger strip corresponding to the through holes in one transverse groove at said heat sink; and a locating plate attached to said CPU connector at one side opposite to said heat sink, said locating plate comprising two pairs of downward hooks bilaterally perpendicularly raised from two opposite ends thereof and respectively inserted through the through holes at said CPU connector and the through holes at said heat sink and hooked in the retaining holes at said retainer plates, and two spring leaves transversely disposed at the two opposite ends outside said downward hooks, said spring leaves each having a middle part connected to said locating plate, and two opposite ends sloping outwardly downwards and then respectively curved upwards.

\* \* \* \* \*